(12) United States Patent
Kato et al.

(10) Patent No.: US 11,335,660 B2
(45) Date of Patent: May 17, 2022

(54) SEMICONDUCTOR MODULE

(71) Applicant: FUJI ELECTRIC CO., LTD., Kawasaki (JP)

(72) Inventors: Ryoichi Kato, Kawasaki (JP); Yuma Murata, Kawasaki (JP); Naoyuki Kanai, Kawasaki (JP); Akito Nakagome, Kawasaki (JP); Yoshinari Ikeda, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/185,953

(22) Filed: Feb. 25, 2021

(65) Prior Publication Data

US 2021/0280549 A1 Sep. 9, 2021

(30) Foreign Application Priority Data

Mar. 6, 2020 (JP) .............................. JP2020-038368

(51) Int. Cl.
*H01L 23/00* (2006.01)
*H01L 23/538* (2006.01)
*H01L 25/07* (2006.01)

(52) U.S. Cl.
CPC .......... *H01L 24/32* (2013.01); *H01L 23/5386* (2013.01); *H01L 24/40* (2013.01); *H01L 24/48* (2013.01); *H01L 25/072* (2013.01); *H01L 2224/3205* (2013.01); *H01L 2224/48137* (2013.01)

(58) Field of Classification Search
CPC ..... H01L 24/32; H01L 23/5386; H01L 24/40; H01L 24/48; H01L 25/072; H01L 2224/3205; H01L 2224/48137; H01L 23/49811; H01L 25/18; H01L 24/73; H01L 2224/371; H01L 2224/41113; H01L 24/41; H01L 24/37; H01L 2224/0603; H01L 2224/40095; H01L 2224/40225; H01L 2224/73221; H01L 2924/00014; H01L 2924/181; H02M 7/5387; H02M 7/003
USPC ........................................................ 257/734
See application file for complete search history.

(56) References Cited

U.S. PATENT DOCUMENTS 8,637,964 B2 1/2014 Jones et al.
2016/0072499 A1 3/2016 Ichikawa

FOREIGN PATENT DOCUMENTS

JP H1074886 A 3/1998
JP 2016058515 A 4/2016

*Primary Examiner* — Elias Ullah
(74) *Attorney, Agent, or Firm* — Rabin & Berdo, P.C.

(57) ABSTRACT

A semiconductor module includes a first semiconductor element and a second semiconductor element each having an upper-surface electrode and a lower-surface electrode, and being connected in parallel to configure an upper arm, a first conductive layer having a U-shape in planar view, having two end portions, and having an upper surface on which the first semiconductor element and the second semiconductor element are disposed in a mirror image arrangement, a positive electrode terminal having a body part and at least two positive electrode ends branched from the body part, and a negative electrode terminal having a negative electrode end disposed between the positive electrode ends. The positive electrode ends are respectively connected to one of the two end portions of the first conductive layer.

10 Claims, 5 Drawing Sheets

SEMICONDUCTOR MODULE

CROSS REFERENCE TO RELATED APPLICATIONS

This application is based upon and claims the benefit of priority of the prior Japanese Patent Application No. 2020-038368, filed on Mar. 6, 2020, the entire contents of which are incorporated herein by reference.

BACKGROUND OF THE INVENTION

Field of the Invention

The present invention relates to a semiconductor module.

Description of the Related Art

A semiconductor device has a substrate having thereon semiconductor elements such as an insulated gate bipolar transistor (IGBT), a power metal oxide semiconductor field effect transistor (MOSFET), or freewheeling diode (FWD) and is used in an inverter apparatus or the like (see Japanese Patent Laid-Open No. 2016-058515, Japanese Patent Laid-Open No. 10-074886, and U.S. Pat. No. 8,637,964, for example).

To suppress a potential difference generated among auxiliary emitter wires which are wires on the reference potential side of IGBT chips connected in parallel with each other, Japanese Patent Laid-Open No. 2016-058515 discloses a three-level inverter circuit, wherein emitter terminals of IGBT chips connected in parallel with each other are connected by a wire which has a large current capacity and has resistance lower than that of an auxiliary emitter wire.

In order to operate an alternating-current motor from a vehicle-mounted direct-current battery, components of a power module require a P terminal and an N terminal that lead current from the direct-current battery, and output terminals (U, V, W) that lead current converted from direct current to alternating current to the motor. Also, for the conversion from direct current to alternating current, three phases of so-called "2-in-1 configurations" are required. According to a configuration of prior art, the flow of current for each phase is from one P terminal toward one N terminal. As a method for connecting the PN terminals and output terminals, screw clamping is adopted because of easier connectivity.

The wiring inductance value between the PN terminals affects a switching loss. For example, as the inductance value decreases, di/dt upon switching can be increased, which can reduce the switching loss.

However, such a structure cannot be realized under the present circumstances, and the inductance value between the PN terminals is high. Therefore, the switching loss cannot be sufficiently reduced.

The present invention has been made in view of these points, and it is one of objects of the present invention to provide a semiconductor module that can reduce inductance between PN terminals and reduce unbalanced switching times caused by potential differences between semiconductor elements.

SUMMARY OF THE INVENTION

A semiconductor module according to one aspect of the present invention includes a first semiconductor element and a second semiconductor element each having an upper-surface electrode and a lower-surface electrode and being connected in parallel to configure an upper arm, a first conductive layer having a U-shape in planar view and having an upper surface on which the first semiconductor element and the second semiconductor element are disposed in a mirror image arrangement, a positive electrode terminal having at least two branching positive electrode ends, one of the positive electrode ends being connected to one end side of the first conductive layer and another one of the positive electrode ends being connected to another end side of the first conductive layer, and a negative electrode terminal having a negative electrode end disposed between the one and the other of the positive electrode ends.

Advantageous Effects of Invention

According to the present invention, inductance between PN terminals can be reduced, and unbalanced switching times caused by potential differences between semiconductor elements can be reduced.

DETAILED DESCRIPTION OF THE PREFERRED EMBODIMENT

Figure 1:
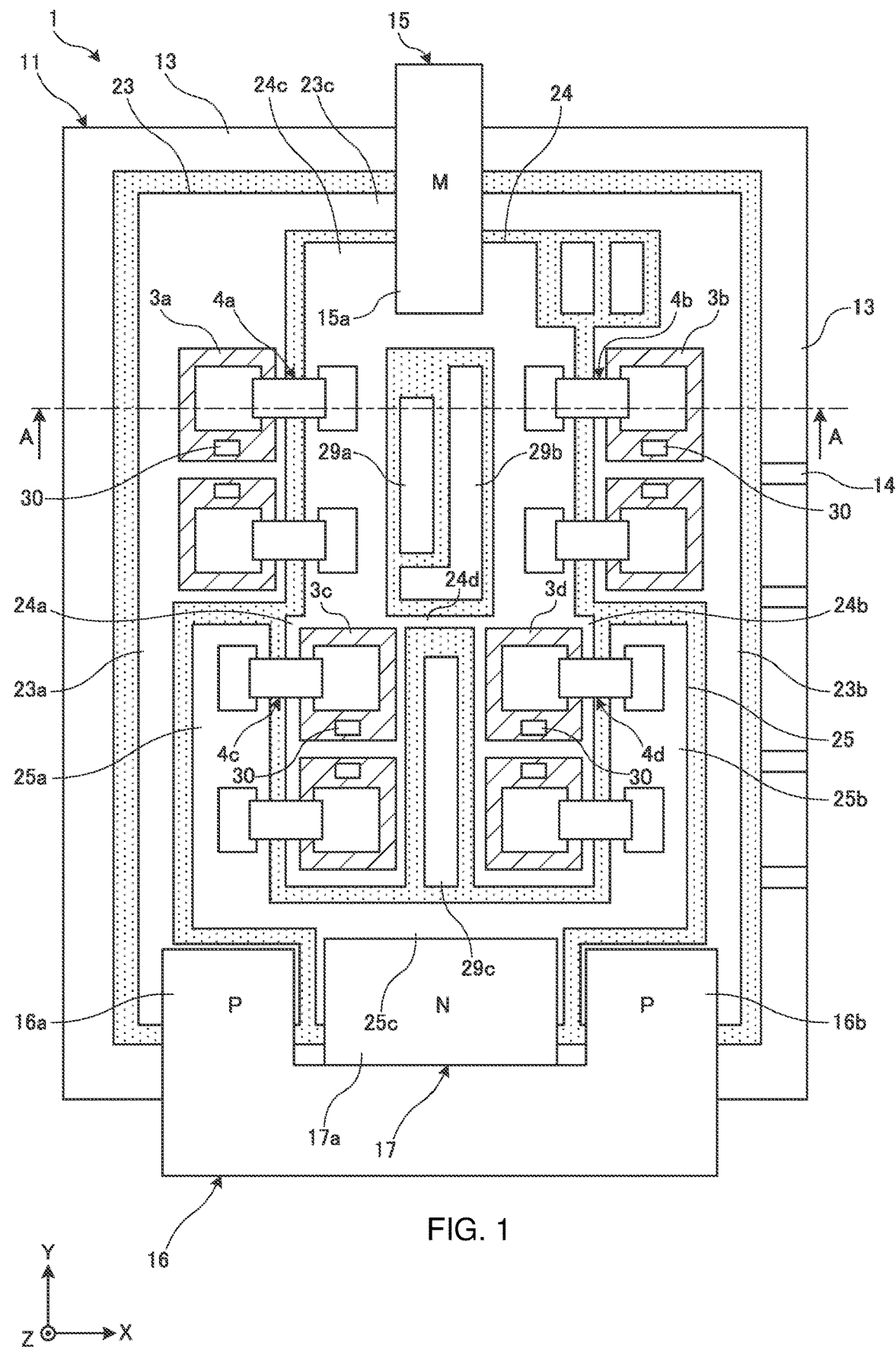
FIG. 1 is a plan view of a semiconductor device according to an embodiment.
Figure 2:
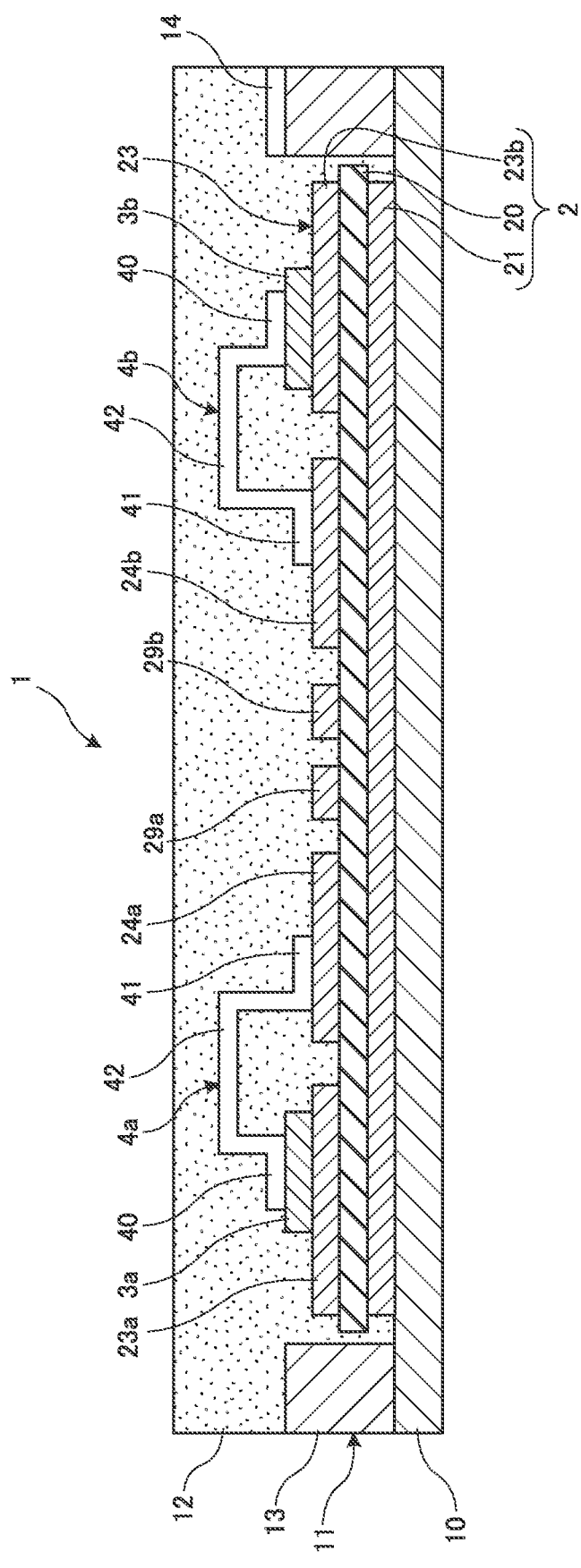
FIG. 2 is a cross-sectional view taken along Line A-A of the semiconductor device shown in FIG. 1.
Figure 3:
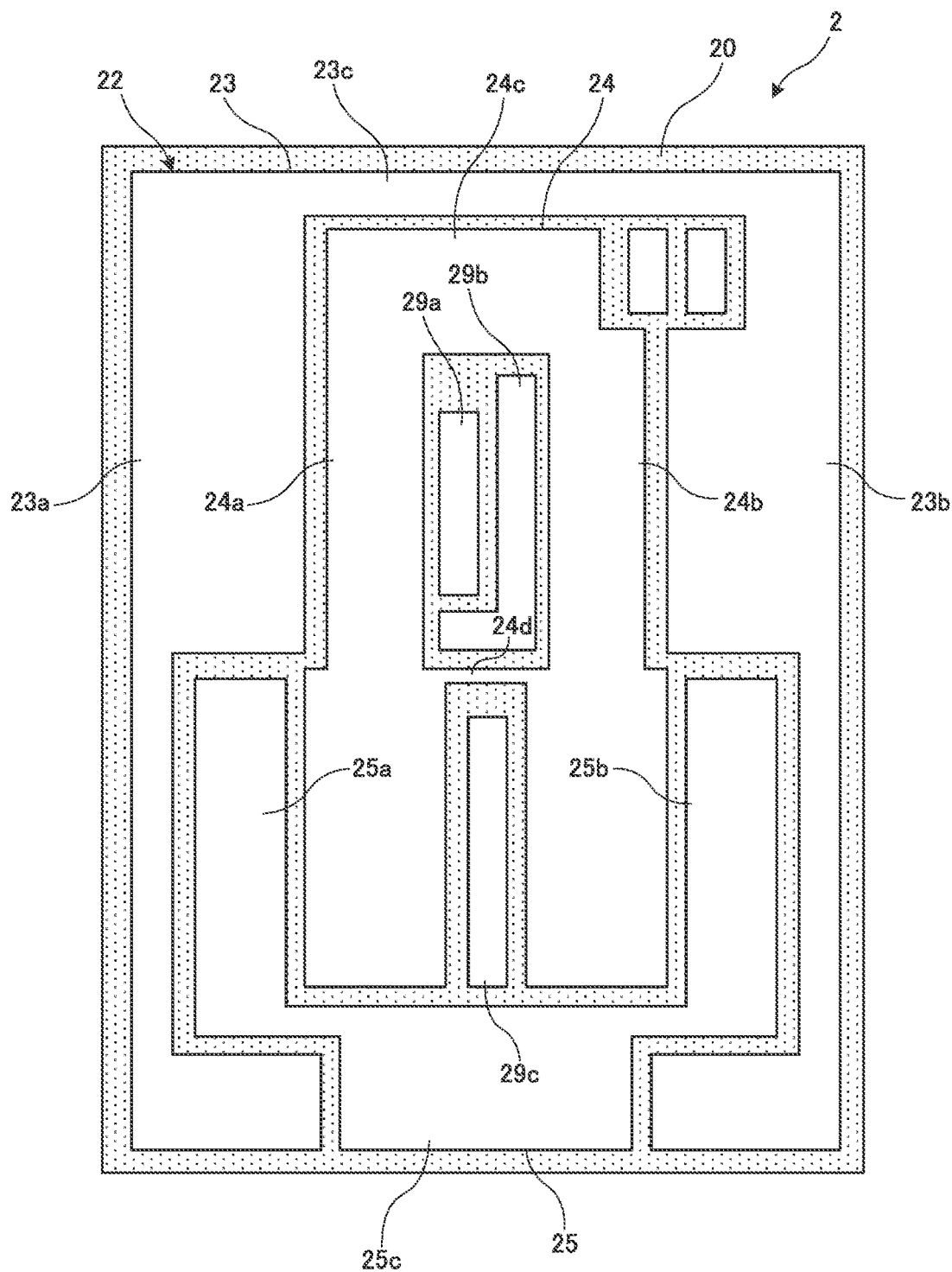
FIG. 3 is a plan view showing a layout of a circuit board according to the embodiment.
Figure 3:
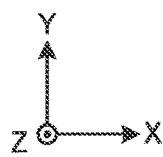
Figure 4:
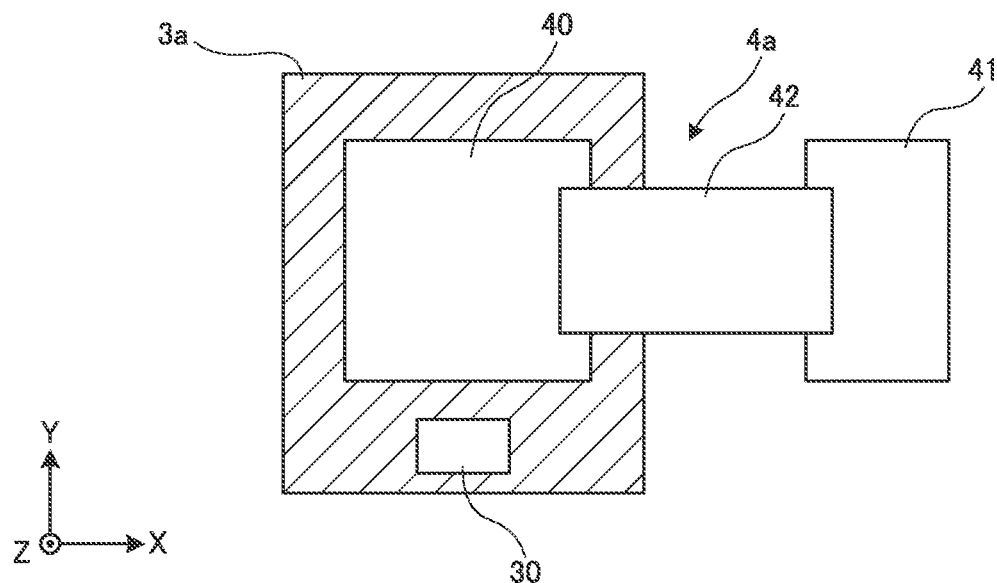
FIG. 4 is a plan view of a semiconductor element according to the embodiment.
Figure 5:
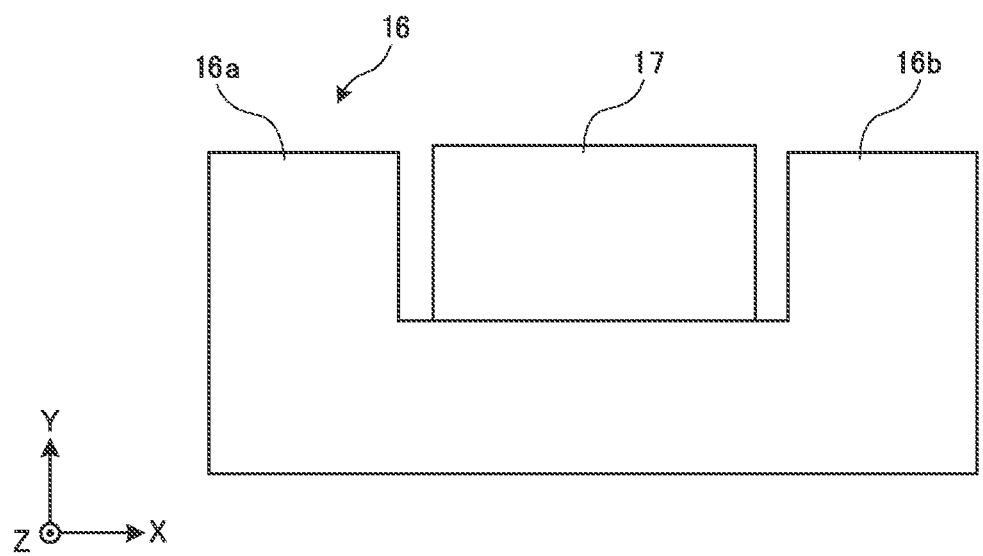
FIG. 5 is a plan view of a P terminal and an N terminal according to the embodiment.

A semiconductor module to which the present invention is applicable is described below. FIG. 1 is a plan view of a semiconductor device according to an embodiment. FIG. 2 is a cross-sectional view taken along Line A-A of the semiconductor device shown in FIG. 1. FIG. 3 is a plan view showing a layout of a circuit board according to the embodiment. FIG. 4 is a plan view of a semiconductor element according to the embodiment. FIG. 5 is a plan view of a P terminal and an N terminal according to the embodiment. Note that the semiconductor module described below is merely an example and, without limiting thereto, can be changed as required.

In the following drawings, the direction in which a plurality of semiconductor modules are arranged, the direction in which an upper arm and a lower arm, which are connected in series, are arranged, and the direction of height are defined as an X-direction, a Y-direction, and a Z-direction, respectively. The shown X, Y, and Z axes are orthogonal to each other and form a right-handed system. In some cases, the X, Y and Z-directions may be referred to as a right-left direction, a front-back direction, and a top-bottom direction, respectively. These directions (right-left, front-back and top-bottom directions) are words used for convenience of description, and, depending on the orientation of the attachment of the semiconductor device, the correspondence relationships with the XYZ directions may be changed. For example, the heat radiating surface side (cooler side) of the semiconductor device is referred to as a "lower surface side", and the opposite side is referred to as an "upper surface side". Planar view herein means that the upper surface of the semiconductor device is viewed from the Z-direction positive side.

The semiconductor device according to this embodiment is applied to a power conversion device in a power module, for example, and is a power module included in an inverter circuit. The semiconductor device includes a semiconductor module 1. With reference to FIG. 1, a single semiconductor module 1 is described. For example, in a case where the semiconductor device is included in a three-phase inverter circuit, three semiconductor modules in FIG. 1 are disposed side by side in the X-direction in order of a U phase, a V phase and a W phase.

As shown in FIGS. 1 to 6, the semiconductor module 1 includes a base plate 10, a laminate substrate 2 disposed on the base plate 10, a plurality of semiconductor elements disposed on the laminate substrate 2, a case member 11 that accommodates the laminate substrate 2 and the semiconductor elements, and a sealing resin 12 filled within the case member 11.

The base plate 10 is an oblong plate having an upper surface and a lower surface. The base plate 10 functions as a heatsink. The base plate 10 has a rectangular shape in planar view elongated in the X-direction. The base plate 10 is a metallic plate of, for example, copper, aluminum or an alloy thereof and the surface may be subjected to plating treatment.

The case member 11 that is rectangular in planar view and has a frame shape is disposed on the upper surface of the base plate 10. The case member 11 is molded with, for example, a synthetic resin and is jointed to the upper surface of the base plate 10 through an adhesive (not shown). Control terminals 14 for external connection are provided in one side wall part 13 of the case member 11. For example, the control terminals 14 are integrally embedded in a side wall part 13 on an X-direction positive side of a pair of side wall parts facing each other in the X-direction of the case member 11.

The control terminals 14 are formed by bending a plate-like body of a metallic material such as a copper material, a copper-alloy-based material, an aluminum-alloy-based material or an iron-alloy-based material. A part of the control terminals 14 is exposed on the upper surface of the side wall part 13. On a pair of side wall parts 13 facing each other in the Y-direction of the case member 11, an output terminal 15 (M terminal) as a case terminal is provided on the Y-direction positive side, and a positive electrode terminal 16 (P terminal) and a negative electrode terminal 17 (N terminal) as case terminals are provided on the Y-direction negative side, the details of which are described below.

Inside of the case member 11, the laminate substrate 2 is disposed on the upper surface of the base plate 10. The laminate substrate 2 is formed by stacking a metallic layer and an insulating layer and is configured by, for example, a direct copper bonding (DCB) substrate, an active metal brazing (AMB) substrate or a metallic base substrate. More specifically, the laminate substrate 2 has an insulating plate 20, a heatsink 21 disposed on a lower surface of the insulating plate 20, and a plurality of circuit boards 22 disposed on an upper surface of the insulating plate 20. The laminate substrate 2 is formed to be, for example, a rectangular shape in planar view.

The insulating plate 20 is formed to have a predetermined thickness in the Z-direction and to be a flat-shaped plate having an upper surface and a lower surface. The insulating plate 20 is formed from an insulating material such as a ceramics material such as alumina ($Al_2O_3$), aluminum nitride (AlN), or silicon nitride ($Si_3N_4$), a resin material such as epoxy, or an epoxy resin material using a ceramics material as a filler. The insulating plate 20 may also be referred to as an insulating layer or an insulating film.

The heatsink 21 is formed to have a predetermined thickness in the Z-direction and to cover the entire lower surface of the insulating plate 20. The heatsink 21 is formed by a metallic plate having a good thermal conductivity of, for example, copper or aluminum.

On the upper surface (main surface) of the insulating plate 20, the plurality of circuit boards 22 are formed to have independent island shapes where the circuit boards 22 are electrically insulated from each other. Each of the plurality of circuit boards 22 is configured by a metallic layer formed of, for example, copper foil and having a predetermined thickness. More specifically, the plurality of circuit boards 22 include first to third conductive layers 23 to 25 each having a U-shape in planar view.

The first conductive layer 23 is positioned on an outermost periphery side of the insulating plate 20. The second conductive layer 24 is positioned on an inner side of the first conductive layer 23. The third conductive layer 25 is positioned between the first conductive layer 23 and the second conductive layer 24 and has an inverted-U shape with respect to the first conductive layer 23 and the second conductive layer 24.

The first conductive layer 23 has a U-shape in planar view having open ends on the Y-direction negative side. More specifically, the first conductive layer 23 has a pair of first elongated parts 23a and 23b extending in a predetermined direction (Y-direction) and facing each other in a direction (X-direction) crossing the predetermined direction, and a first connection part 23c connecting one ends of the pair of the first elongated parts 23a and 23b. The first connection part 23c connects ends on the Y-direction positive side of the pair of the first elongated parts 23a and 23b. On the first conductive layer 23, a first semiconductor element 3a and a second semiconductor element 3b are disposed in a mirror image arrangement, details of which are described below.

The second conductive layer 24 has a U-shape in planar view having open ends on the Y-direction negative side. More specifically, the second conductive layer 24 has a pair of second elongated parts 24a and 24b extending in the predetermined direction (Y-direction) and facing each other in the direction (X-direction) crossing the predetermined direction, a second connection part 24c connecting one ends of the pair of the second elongated parts 24a and 24b, and a third connection part 24d connecting middle regions in the Y-direction of the pair of the second elongated parts 24a and 24b.

The second connection part 24c connects ends on the Y-direction positive side of the pair of the second elongated parts 24a and 24b. On the second conductive layer 24, a third semiconductor element 3c and a fourth semiconductor element 3d are disposed in a mirror image arrangement, the details of which are described below. On the inner side of the first conductive layer 23, the second conductive layer 24 is disposed with a pair of ends (ends on the Y-direction negative side of the pair of the second elongated parts 24a and 24b) directed toward the negative electrode terminal 17 (negative electrode end 17a) which is described below. The ends on the Y-direction negative side of the pair of the second elongated parts 24a and 24b are positioned closer to the Y-direction positive side than the ends on the Y-direction negative side of the pair of the first elongated parts 23a and 23b.

The third conductive layer 25 has a U-shape in planar view having open ends on the Y-direction positive side. In other words, the third conductive layer 25 has an inverted-U shape in planar view with respect to the first conductive layer 23 and the second conductive layer 24. The third conductive layer 25 is disposed to surround a side having the pair of the ends (ends on the Y-direction negative side of the pair of the second elongated parts 24a and 24b) of the second conductive layer 24 on the inner side of the first conductive layer 23.

More specifically, the third conductive layer 25 has a pair of third elongated parts 25a and 25b extending in the predetermined direction (Y-direction) and facing each other in the direction (X-direction) crossing the predetermined direction, and a fourth connection part 25c connecting one ends of the pair of the third elongated parts 25a and 25b. The fourth connection part 25c connects ends on the Y-direction negative side of the pair of the third elongated parts 25a and 25b. The fourth connection part 25c is positioned closer to the Y-direction negative side than the pair of the second elongated parts 24a and 24b and is provided between the ends on the Y-direction negative side of the pair of the first elongated parts 23a and 23b.

Relatively narrower control circuit boards 29a to 29c extending in the Y-direction are disposed between the pair of the second elongated parts 24a and 24b. The control circuit boards 29a and 29b are disposed side by side in the X-direction closer to the Y-direction positive side than the third connection part 24d. The control circuit board 29c is disposed closer to the Y-direction negative side than the third connection part 24d. A wire for control (not shown) is connected to these control circuit boards 29a to 29c. The plurality of circuit boards 22 configured in this way are disposed in a mirror image arrangement with respect to the X-direction center of the laminate substrate 2.

A plurality of semiconductor elements 3 are disposed at predetermined positions on the upper surfaces of the circuit boards 22 through a jointing material (not shown) such as soldering. Each of the semiconductor elements is formed to have a square shape in planar view by a semiconductor substrate of, for example, silicon (Si), silicon carbide (SiC), or gallium nitride (GaN). According to this embodiment, each of the semiconductor elements is configured by a reverse conducting (RC)-IGBT element integrally having functions of an insulated gate bipolar transistor (IGBT) element and a freewheeling diode (FWD) element.

Without limiting thereto, each of the semiconductor elements may be configured by a combination of a switching element such as an IGBT, a power metal oxide semiconductor field effect transistor (MOSFET) or a bipolar junction transistor (BJT) and a diode such as a freewheeling diode (FWD). Alternatively, for example, a reverse blocking (RB)-IGBT having sufficient resistance to pressure against reverse bias may be used as the semiconductor elements. The shape, arranged number and arranged positions of the semiconductor elements may be changed as required.

According to this embodiment, eight semiconductor elements are disposed for one phase. More specifically, according to this embodiment, two first semiconductor elements 3a, two second semiconductor elements 3b, two third semiconductor elements 3c, and two fourth semiconductor elements 3d are disposed side by side in the Y-direction. Each of the semiconductor elements has an upper-surface electrode (which may be referred to as an emitter electrode or a source electrode) and a lower-surface electrode (which may be referred to as a collector electrode or a drain electrode). Each of the semiconductor elements further has a gate electrode 30 (see FIG. 4) disposed at a deviated position on the outer periphery side of the upper surface. The gate electrodes 30 in each pair of the two first semiconductor elements 3a, two second semiconductor elements 3b, two third semiconductor elements 3c, and two fourth semiconductor elements 3d face each other in the Y-direction.

The first semiconductor elements 3a are disposed on an upper surface of the first elongated part 23a. In other words, the lower-surface electrodes of the first semiconductor elements 3a are conductively connected to the first elongated part 23a. The two first semiconductor elements 3a are disposed at positions deviated to the Y-direction positive side of the first elongated part 23a and are connected in parallel.

The second semiconductor elements 3b are disposed on an upper surface of the first elongated part 23b. In other words, the lower-surface electrodes of the second semiconductor elements 3b are conductively connected to the first elongated part 23b. The two second semiconductor elements 3b are disposed at positions deviated to the Y-direction positive side of the first elongated part 23b and are connected in parallel.

The third semiconductor elements 3c are disposed on an upper surface of the second elongated part 24a. In other words, the lower-surface electrodes of the third semiconductor elements 3c are conductively connected to the second elongated part 24a. The two third semiconductor elements 3c are disposed at positions deviated to the Y-direction negative side of the second elongated part 24a and are connected in parallel.

The fourth semiconductor elements 3d are disposed on an upper surface of the second elongated part 24b. In other words, the lower-surface electrodes of the fourth semiconductor elements 3d are conductively connected to the second elongated part 24b. The two fourth semiconductor elements 3d are disposed at positions deviated to the Y-direction negative side of the second elongated part 24b and are connected in parallel.

The first semiconductor elements 3a and the second semiconductor elements 3b are connected in parallel to configure an upper arm, and the third semiconductor elements 3c and the fourth semiconductor elements 3d are connected in parallel to configure a lower arm. The upper arm and the lower arm are connected in series. As shown in FIG. 1, the first semiconductor elements 3a and the second semiconductor elements 3b are disposed at positions deviated to a side having the output terminal 15, which is described below, and the third semiconductor elements 3c and the fourth semiconductor elements 3d are disposed at positions deviated to a side having the negative electrode terminal 17. The third semiconductor elements 3c and the fourth semiconductor elements 3d are disposed closer to another end side of the pair of the second elongated parts 24a and 24b than the third connection part 24d. Furthermore, the pair of ends of the third conductive layer 25 (the ends on the Y-direction positive side of the third elongated parts 25a and 25b) face the first semiconductor elements 3a or the second semiconductor elements 3b.

The first semiconductor elements 3a and the third semiconductor elements 3c, and the second semiconductor elements 3b and the fourth semiconductor elements 3d are disposed in a mirror image arrangement with respect to the X-direction center of the laminate substrate 2. The first semiconductor elements 3a and the second semiconductor elements 3b included in the upper arm are disposed away from the X-direction center of the laminate substrate 2 while the third semiconductor elements 3c and the fourth semiconductor elements 3d included in the lower arm are disposed closely to the X-direction center of the laminate substrate 2.

The upper-surface electrodes of the semiconductor elements and the predetermined circuit boards 22 are electrically connected via metallic wiring boards (first to fourth wires 4a to 4d) as a main current wiring member. The first wire 4a connects the upper-surface electrode of the first semiconductor element 3a and the second elongated part 24a. The second wire 4b connects the upper-surface electrode of the second semiconductor element 3b and the second elongated part 24b. The third wire 4c connects the upper-surface electrode of the third semiconductor element 3c and the third elongated part 25a. The fourth wire 4d connects the upper-surface electrode of the fourth semiconductor element 3d and the third elongated part 25b.

Each of the metallic wiring boards is formed by bending, through, for example, press processing, a metallic material such as a copper material, a copper-alloy-based material, an aluminum-alloy-based material or an iron-alloy-based material. Because all of the metallic wiring boards have the same configuration, a common reference is given for description. More specifically, as shown in FIG. 4, the metallic wiring board includes a first junction part 40 to be jointed with the upper-surface electrode of the predetermined semiconductor element, a second junction part 41 to be jointed with the predetermined circuit board 22, and a connection part 42 that connects the first junction part 40 and the second junction part 41. The shape of the metallic wiring board shown in FIG. 4 is merely an example and can be changed as required. Each of the metallic wiring boards may be referred to as a lead frame. The metallic wiring boards (first to fourth wires 4a to 4d) extend in the X-direction in the planar view shown in FIG. 1.

In the case member 11, the output terminal 15, the positive electrode terminal 16, and the negative electrode terminal 17 are provided as case terminals for external connection of the main current as described above. The output terminal 15 is disposed on the Y-direction positive side of the pair of side wall parts 13 facing each other in the Y-direction of the case member 11. The positive electrode terminal 16 and the negative electrode terminal 17 are disposed on the Y-direction negative side of the pair of side wall parts 13 facing each other in the Y-direction of the case member 11.

Each of those case terminals are formed by, for example, press processing, for example, a metallic material such as a copper material, a copper-alloy-based material, an aluminum-alloy-based material or an iron-alloy-based material. The output terminal 15 has an output end 15a connected to the second connection part 24c.

As shown in FIG. 1 and FIG. 5, the positive electrode terminal 16 has two branching positive electrode ends 16a and 16b. The positive electrode ends 16a and 16b are disposed side by side in the X-direction with a predetermined interval therebetween. The negative electrode terminal 17 (negative electrode end 17a) is provided between the positive electrode ends 16a and 16b. The positive electrode end 16a positioned on the X-direction negative side is connected to the end on the Y-direction negative side of the first elongated part 23a (one end side of the first conductive layer 23). The positive electrode end 16b positioned on the X-direction positive side is connected to the end on the Y-direction negative side of the first elongated part 23b (another end side of the first conductive layer 23). The negative electrode terminal 17 has the negative electrode end 17a connected to the fourth connection part 25c.

Since the inductance between PN terminals affects a switching loss in a semiconductor module, reduction of the inductance has been demanded. With the recent innovation of technologies, when a next-generation device (which may also be referred to as a wideband gap semiconductor) of SiC, GaN, or the like is adopted in a high-output and high-frequency inverter, reduction of unbalanced switching times caused by potential differences between the semiconductor elements is further demanded.

Figure 6:
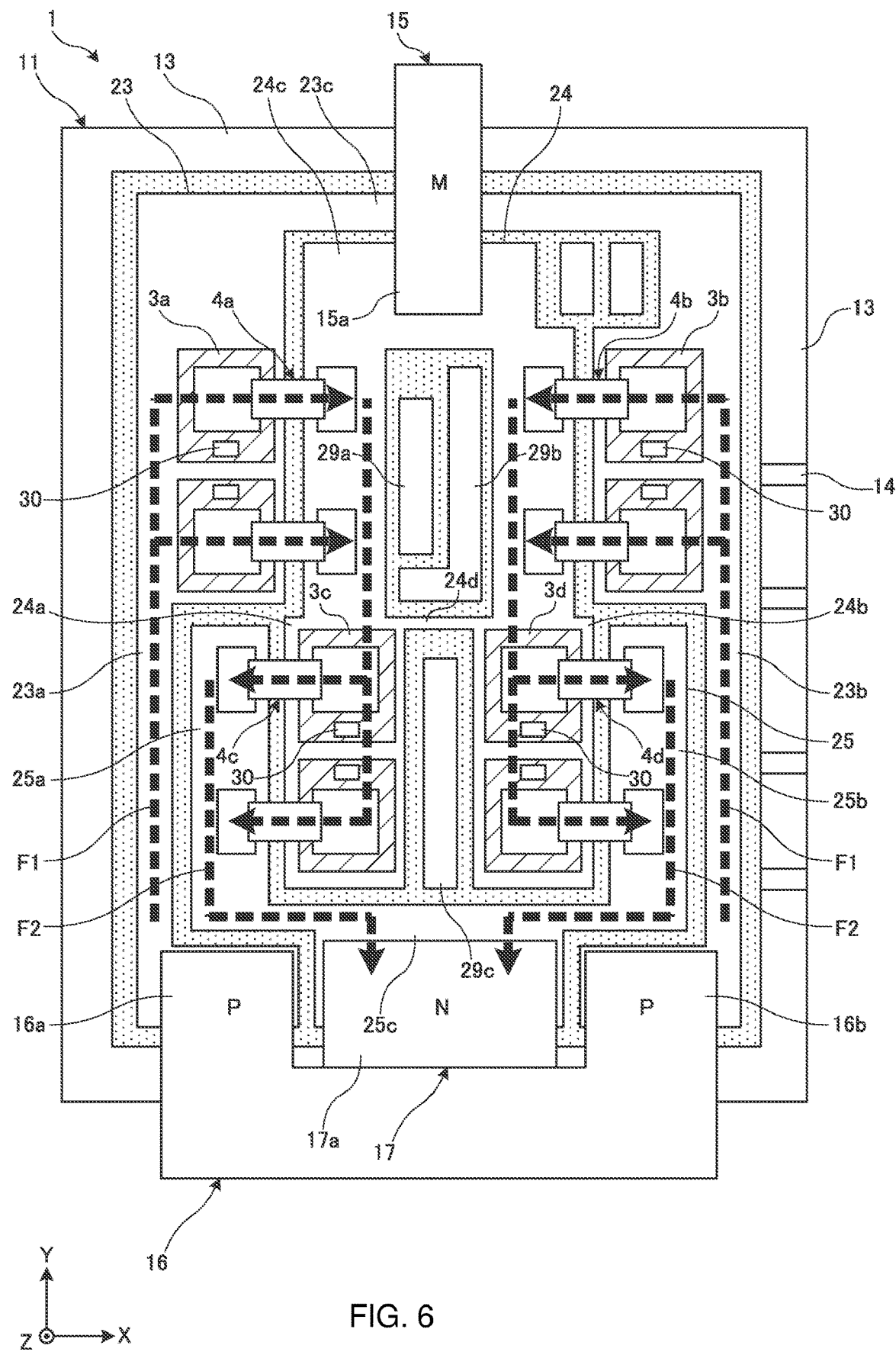
FIG. 6 is a schematic view showing flows of current in a semiconductor module according to the embodiment.

Accordingly, the present inventors have focused on the layout of the circuit boards, semiconductor elements and case terminals on an insulating substrate and have reached the present invention. FIG. 6 is a schematic view showing flows of current in a semiconductor module according to the embodiment. More specifically, according to this embodiment, as shown in FIG. 6, a plurality of circuit boards on which semiconductor elements are disposed are formed in U-shapes in planar view and are disposed in a mirror image arrangement.

More specifically, the first semiconductor elements 3a and the second semiconductor elements 3b included in the upper arm are disposed in a mirror image arrangement on the first conductive layer 23 having a U-shape in planar view. The positive electrode terminal 16 has two branching positive electrode ends 16a and 16b. One positive electrode end 16a is connected to one end side of the first conductive layer 23, and the other positive electrode end 16b is connected to another end side of the first conductive layer 23. Furthermore, the negative electrode end 17a is disposed between the positive electrode ends 16a and 16b.

The third semiconductor elements 3c and the fourth semiconductor elements 3d included in the lower arm are disposed in a mirror image arrangement on the second conductive layer 24 having a U-shape in planar view. A pair of ends of the second conductive layer 24 is directed toward the negative electrode end 17a provided on the Y-direction negative side.

The third conductive layer 25 having an inverted-U shape in planar view with respect to the first conductive layer 23 and the second conductive layer 24 is disposed to surround the side having the pair of the ends of the second conductive layer 24 on the inner side of the first conductive layer 23. The pair of the ends of the third conductive layer 25 face the first semiconductor elements 3a or the second semiconductor elements 3b.

In this way, according to this embodiment, in order to reduce the PN inductance, (1) the number of parallel columns through which the main current flows is increased from conventional one to two; and (2) a wiring pattern (circuit board layout) is adopted in which the current paths between the P terminal and the N terminal are parallel with each other such that the length of the current paths can be reduced as much as possible.

As shown in FIG. 6, in the semiconductor module 1, the main current flowing from the positive electrode terminal 16 is divided into two by the positive electrode ends 16a and 16b on both outer sides. The main current flows from the first conductive layer 23 (the pair of the first elongated parts 23a and 23b) through the first semiconductor elements 3a and the second semiconductor elements 3b in the upper arm to the second conductive layer (second elongated parts 24a and 24b). The main current further flows through the third semiconductor elements 3c and the fourth semiconductor elements 3d in the lower arm, to flow from the third conductive layer 25 (third elongated parts 25a and 25b) into the negative electrode end 17a.

In this way, according to this embodiment, as shown in FIG. 6, a current path F1 in the upper arm and a current path F2 in the lower arm are parallel and adjacent to each other, and the main currents flow in the opposite directions to each other. Therefore, because of an effect of mutual inductance, reduction of the inductance can be realized, and the switching loss is reduced. Since a configuration is adopted in which each of the case terminals has a plurality of branching ends, the degree of adhesion between the other members can be improved when sealed with a resin, and the members cannot be easily peeled off. The entire layout is disposed in a mirror image arrangement as described above, and each of the conductive layers includes a pair of elongated parts and a connection part connecting them. Thus, through the connection parts, current can be fed equally to the positive side and the negative side in the X-direction. In other words, even though the current path is divided into two, deviation of the currents does not easily occur, and local heating can be suppressed.

As described above, according to this embodiment, the inductance between the PN terminals can be reduced, and unbalanced switching times caused by potential differences between the semiconductor elements can be reduced.

In the embodiment above, the number and arranged positions of the semiconductor elements are not limited to the configuration above but can be changed as required.

In the embodiment above, the number and layout of the circuit boards are not limited to the configuration above but can be changed as required.

Although the laminate substrate 2 and the semiconductor elements are formed to be in a rectangular shape or square shape in planar view according to the embodiment above, the present invention is not limited to the configuration. The laminate substrate 2 and the semiconductor elements may be formed to have a polygonal shape other than those described above.

Having described the embodiment and the variation examples, the above embodiment and the variation examples may be wholly or partially combined as another embodiment.

The embodiments are not limited to the above-described embodiment and variation examples, and various changes, replacements and modifications may be made thereto without departing from the spirit and scope of the technical idea. If the technical idea can be implemented in another manner based on a technological advancement or another technology derived therefrom, the technical idea may be carried out by such method. Therefore, the claims cover all embodiments that can be included within the scope of the technical idea.

Feature points of the above-described embodiment are organized below.

A semiconductor module according to the above-described embodiment includes a first semiconductor element and a second semiconductor element each having an upper-surface electrode and a lower-surface electrode and being connected in parallel to configure an upper arm, a first conductive layer having a U-shape in planar view and having an upper surface on which the first semiconductor element and the second semiconductor element are disposed in a mirror image arrangement, a positive electrode terminal having at least two branching positive electrode ends, one of the positive electrode ends being connected to one end side of the first conductive layer and another one of the positive electrode ends being connected to another end side of the first conductive layer, and a negative electrode terminal having a negative electrode end disposed between the one and the other of the positive electrode ends.

In the semiconductor module described above, the first conductive layer has a pair of first elongated parts extending in a predetermined direction and facing each other in a direction crossing the predetermined direction, and a first connection part connecting one ends of the pair of the first elongated parts, the first semiconductor element is disposed on one of the first elongated parts, and the second semiconductor element is disposed on another one of the first elongated parts.

The semiconductor module described above further includes a third semiconductor element and a fourth semiconductor element each having an upper-surface electrode and a lower-surface electrode and being connected in parallel to configure a lower arm, and a second conductive layer having a U-shape in planar view and having an upper surface on which the third semiconductor element and the fourth semiconductor element are disposed in a mirror image arrangement. The second conductive layer is disposed with a pair of ends directed toward the negative electrode end on an inner side of the first conductive layer.

In the semiconductor module described above, the second conductive layer has a pair of second elongated parts extending in a predetermined direction and facing each other in a direction crossing the predetermined direction, and a second connection part connecting one ends of the pair of the second elongated parts, the third semiconductor element is disposed on one of the second elongated parts, the fourth semiconductor element is disposed on another one of the second elongated parts, and an output terminal is connected to the second connection part.

In the semiconductor module described above, the first semiconductor element and the second semiconductor element are disposed at positions deviated to one end side of the pair of the first elongated parts, and the third semiconductor element and the fourth semiconductor element are disposed at positions deviated to another end side of the pair of the second elongated parts.

In the semiconductor module described above, the second conductive layer further has a third connection part connecting middle regions of the pair of the second elongated parts, and the third semiconductor element and the fourth semiconductor element are disposed closer to the other end side of the pair of the second elongated parts than the third connection part.

The semiconductor module described above further includes a third conductive layer having an inverted-U shape in planar view with respect to the first conductive layer and the second conductive layer and being disposed to surround a side having a pair of ends of the second conductive layer on the inner side of the first conductive layer. The third conductive layer has a pair of ends facing the first semiconductor element or the second semiconductor element.

In the semiconductor module described above, the third conductive layer has a pair of third elongated parts extending in a predetermined direction and facing each other in a direction crossing the predetermined direction, and a fourth connection part connecting one ends of the pair of the third elongated parts, and the negative electrode end is connected to the fourth connection part.

In the semiconductor module described above, a plurality of the first semiconductor elements and a plurality of the second semiconductor elements are disposed along a direction of extension of the pair of the first elongated parts, and a plurality of the third semiconductor elements and a plurality of the fourth semiconductor elements are disposed along a direction of extension of the pair of the second elongated parts.

INDUSTRIAL APPLICABILITY

As described above, the present invention has an effect that the inductance between the PN terminals can be reduced and is particularly advantageous in a semiconductor module.

REFERENCE SIGNS LIST

1: semiconductor module
2: laminate substrate
3a: first semiconductor element
3b: second semiconductor element
3c: third semiconductor element
3d: fourth semiconductor element
4a: first wire
4b: second wire
4c: third wire
4d: fourth wire
10: base plate
11: case member
12: sealing resin
13: side wall part
14: control terminal
15: output terminal
15a: output end
16: positive electrode terminal
16a: positive electrode end
16b: positive electrode end
17: negative electrode terminal
17a: negative electrode end
20: insulating plate
21: heatsink
22: circuit board
23: first conductive layer
23a: first elongated part
23b: first elongated part
23c: first connection part
24: second conductive layer
24a: second elongated part
24b: second elongated part
24c: second connection part
24d: third connection part
25: third conductive layer
25a: third elongated part
25b: third elongated part
25c: fourth connection part
29a: control circuit board
29b: control circuit board
29c: control circuit board
30: gate electrode
40: first junction part
41: second junction part
42: connection part
F1: current path
F2: current path

What is claimed is:

1. A semiconductor module, comprising:
a first semiconductor element and a second semiconductor element each having an upper surface and a lower surface opposite to each other, and having an upper-surface electrode on the upper surface thereof and a lower-surface electrode on the lower surface thereof, the first and second semiconductor elements being electrically connected in parallel to each other to configure an upper arm;
a first conductive layer having a U-shape in planar view of the semiconductor module and having two end portions, the first conductive layer having an upper surface on which the first semiconductor element and the second semiconductor element are disposed in a mirror image arrangement;
a positive electrode terminal having a body part and at least two positive electrode ends branched from the body part, one of the positive electrode ends being connected to one of the two end portions of the first conductive layer and an other of the positive electrode ends being connected to the other of said two end portions; and
a negative electrode terminal having a negative electrode end disposed between the one and said other of the positive electrode ends.

2. The semiconductor module according to claim 1, wherein:
the first conductive layer has
two first elongated parts, each extending in a first direction and having first and second ends that are opposite to each other in the first direction, each of the two first elongated parts having one of the two end portions at the first end thereof, and
a first connection part connecting together the second ends of said two first elongated parts;
the first semiconductor element is disposed on one of the two first elongated parts; and
the second semiconductor element is disposed on the other of the two first elongated parts.

3. The semiconductor module according to claim 2, further comprising:
a third semiconductor element and a fourth semiconductor element each having an upper surface and a lower surface opposite to each other, and having an upper-surface electrode on the upper surface thereof and a lower-surface electrode on the lower surface thereof, the third and fourth semiconductor elements being electrically connected to each other in parallel to configure a lower arm; and
a second conductive layer having a U-shape in the planar view and having two end portions, the second conductive layer having an upper surface on which the third semiconductor element and the fourth semiconductor element are disposed in a mirror image arrangement,
wherein the second conductive layer is disposed between the first elongated parts, and the two end portions of the second conductive layer face the negative electrode terminal.

4. The semiconductor module according to claim 3, further comprising an output terminal, wherein:
the second conductive layer has
two second elongated parts extending in a second direction and having first and second ends opposite to each other in the second direction, each of the two second elongated parts having one of the two end portions of the second conductive layer at the first end thereof, and
a second connection part connecting together the second ends of said two second elongated parts;
the third semiconductor element is disposed on one of the two second elongated parts;
the fourth semiconductor element is disposed on the other of the two second elongated parts; and the output terminal is connected to the second connection part.

5. The semiconductor module according to claim 4, wherein
    each of the first semiconductor element and the second semiconductor element is disposed at a position closer to the first connecting part than to the first end of a corresponding one of the two first elongated parts, and
    each of the third semiconductor element and the fourth semiconductor element is disposed at a position closer to the first end of the one of the two second elongated parts than to the second connecting portion.

6. The semiconductor module according to claim 5, wherein
    the second conductive layer further has a third connection part connecting together respective middle regions of the two second elongated parts, in the second direction, and
    each of the third semiconductor element and the fourth semiconductor element is disposed between the other end portions of the respective second elongated parts upon which it is disposed and the third connection part.

7. The semiconductor module according to claim 4, further comprising a third conductive layer having an inverted-U shape in the planar view with respect to the first conductive layer and the second conductive layer, and having two end portions, the third conductive layer being disposed between the two first elongated parts of the first conductive layer and to surround the two end portions of the second conductive layer, wherein
    the two end portions of the third conductive layer respectively face one of the first semiconductor element or the second semiconductor element.

8. The semiconductor module according to claim 7, wherein
    the third conductive layer further has
        two third elongated parts, each extending in a third direction and having first and second ends opposite to each other in the third direction, each of the two third elongated parts having one of the two end portions of the third conductive layer at the first end thereof; and
        a fourth connection part connecting together the second ends of the two third elongated parts, and
    the negative electrode end is connected to the fourth connection part.

9. The semiconductor module according to claim 4, wherein
    the first semiconductor element and the second semiconductor element each are provided in plurality and respectively are disposed on the one and the other of the two first elongated parts, and
    the third semiconductor element and the fourth semiconductor element each are provided in plurality and respectively disposed on the one and the other of the two second elongated parts, along the second direction.

10. The semiconductor module according to claim 7, wherein the first, second and third elongated parts are disposed in parallel to one another.

* * * * *